(12) United States Patent
Aihara et al.

(10) Patent No.: US 7,403,386 B2
(45) Date of Patent: Jul. 22, 2008

(54) ELECTROSTATIC CHUCK

(75) Inventors: Yasufumi Aihara, Nagoya (JP); Hideyoshi Tsuruta, Tokai (JP); Keiji Kawasaki, Seto (JP)

(73) Assignee: NGK Insulators, Ltd., Nagoya (JP)

( * ) Notice: Subject to any disclaimer, the term of this patent is extended or adjusted under 35 U.S.C. 154(b) by 93 days.

(21) Appl. No.: 11/449,551

(22) Filed: Jun. 8, 2006

(65) Prior Publication Data

US 2006/0279899 A1 Dec. 14, 2006

Related U.S. Application Data

(60) Provisional application No. 60/689,145, filed on Jun. 9, 2005.

(51) Int. Cl.
*H05K 7/20* (2006.01)
*H01T 23/00* (2006.01)

(52) U.S. Cl. .................. 361/694; 361/234; 361/690

(58) Field of Classification Search .............. None
See application file for complete search history.

(56) References Cited

U.S. PATENT DOCUMENTS

| | | | | |
|---|---|---|---|---|
| 6,125,025 | A * | 9/2000 | Howald et al. | 361/234 |
| 6,179,921 | B1 * | 1/2001 | Ruffell et al. | 118/715 |
| 6,223,447 | B1 | 5/2001 | Yudovsky et al. | |
| 6,292,346 | B1 * | 9/2001 | Ohno et al. | 361/234 |
| 6,490,146 | B2 * | 12/2002 | Wang et al. | 361/234 |
| 6,494,955 | B1 | 12/2002 | Lei et al. | |
| 6,538,872 | B1 * | 3/2003 | Wang et al. | 361/234 |
| 6,549,393 | B2 * | 4/2003 | Kanno et al. | 361/234 |
| 7,004,180 | B2 * | 2/2006 | Akiba | 134/22.1 |
| 7,102,872 | B2 * | 9/2006 | Cho et al. | 361/234 |
| 7,209,339 | B2 * | 4/2007 | Kitabayashi et al. | 361/234 |
| 2003/0107866 | A1 * | 6/2003 | Lee et al. | 361/234 |
| 2004/0085706 | A1 * | 5/2004 | Tomoyoshi | 361/234 |

FOREIGN PATENT DOCUMENTS

JP 2002-093894 A1 3/2002

* cited by examiner

*Primary Examiner*—Boris L Chervinsky
(74) *Attorney, Agent, or Firm*—Burr & Brown (57) ABSTRACT

An electrostatic chuck includes; a base made of ceramics, in which an electrode generating electrostatic attractive force is embedded; a cooling member which contains metal; a bonding material which bonds the base and the cooling member to each other; a gas providing passage which penetrates the base, the bonding material, and the cooling member; and an engagement member and a bolt member, which are fixing members mechanically fixing the base and the cooling member to each other.

8 Claims, 5 Drawing Sheets

ELECTROSTATIC CHUCK

CROSS REFERENCE TO RELATED APPLICATIONS

This application is based upon and claims the benefit of priority from prior U.S. Provisional Application No. 60/689,145, filed on Jun. 9, 2005; the entire contents of which are incorporated herein by reference.

BACKGROUND OF THE INVENTION

1. Field of the Invention

The present invention relates to an electrostatic chuck for use in manufacturing a semiconductor device and the like.

2. Description of the Related Art

Heretofore, in processing steps such as exposure, physical vapor deposition (PVD), chemical vapor deposition (CVD) and etching in manufacture of a semiconductor device and a liquid crystal device, an electrostatic chuck which attracts and holds a semiconductor substrate and a glass substrate has been used (for example, refer to Japanese Patent Laid-Open Publication No. 2002-93894).

The electrostatic chuck is constructed by bonding, for example, a base made of ceramics and a cooling member made of aluminum to each other by using an organic bonding material such as silicone resin and acrylic resin. When the organic bonding material is heated up to a temperature of 100° C. or more, bonding force thereof is reduced to a large extent.

Here, the ceramics and the aluminum are different from each other in thermal expansion coefficient, and accordingly, when the electrostatic chuck is heated up, stresses occur on a bonded interface between the base and the boding material, and on a bonded interface between the cooling member and the bonding material.

Meanwhile, a processing temperature in the etching and the like has heretofore been 100° C. or less as a mainstream; however, the processing temperature has reached 100 to 200° C. recently, and development of an electrostatic chuck usable in such a temperature range has been implemented.

However, the conventional electrostatic chuck described above is constructed by the bonding using the organic bonding material, and accordingly, when the electrostatic chuck is used at a temperature as high as 100° C. or more, there has been a possibility that exfoliation occurs in such a bonded portion of the base and the cooling member (specifically, the bonded interface between the base and the bonding material, and the bonded interface between the bonding material and the cooling member), and that gas tightness in the bonded interfaces described above is thus reduced. As a result, there has been a possibility that gas to be provided onto a substrate mounting surface of a surface of the base through a gas providing passage passes through the above-described bonded interfaces, and leaks to an outside of the electrostatic chuck (that is, into a chamber).

Note that a method is also conceivable, which performs the bonding by using a sheet of metal such as aluminum in place of the organic bonding material. However, in this case, it has been necessary to fabricate the cooling member by a material (for example, an Al—SiC composite material) whose thermal expansion coefficient is adjusted very approximately to the thermal expansion coefficient of the ceramics, causing a problem that cost is increased to an extremely large extent.

SUMMARY OF THE INVENTION

In this connection, it is an object of the present invention to provide an electrostatic chuck which restricts the gas to be provided onto the substrate mounting surface of the base surface from passing through the bonded portion of the base and the cooling member and leaking to the outside of the electrostatic chuck even at the temperature as high as 100° C. or more.

In order to achieve the above-described object, an electrostatic chuck according to the present invention includes: a base which contains ceramics, in which an electrode generating electrostatic attractive force is embedded; a cooling member which contains metal; a bonding material which bonds the base and the cooling member to each other; a gas providing hole which penetrates the base, the bonding material, and the cooling member; and a fixing member which mechanically fixes the base and the cooling member to each other.

In the electrostatic chuck according to the present invention, the fixing member which mechanically fixes the base and the cooling member to each other is provided. Accordingly, even in the case where the electrostatic chuck is used at the temperature as high as 100° C. or more, the base and the cooling member can be surely brought into intimate contact with each other. Thus, gas to be flown onto the substrate mounting surface of the base surface under a high-temperature environment can be restricted from passing through the bonded portion of the base and the cooling member and leaking to the outside of the electrostatic chuck.

Moreover, since the base and the cooling member can be mechanically fixed to each other by using the above-described fixing member, the cooling member can be surely fixed to the base at low cost.

DETAILED DESCRIPTION OF THE EMBODIMENTS

A description will be made below of embodiments of the present invention.

First Embodiment

Figure 1:
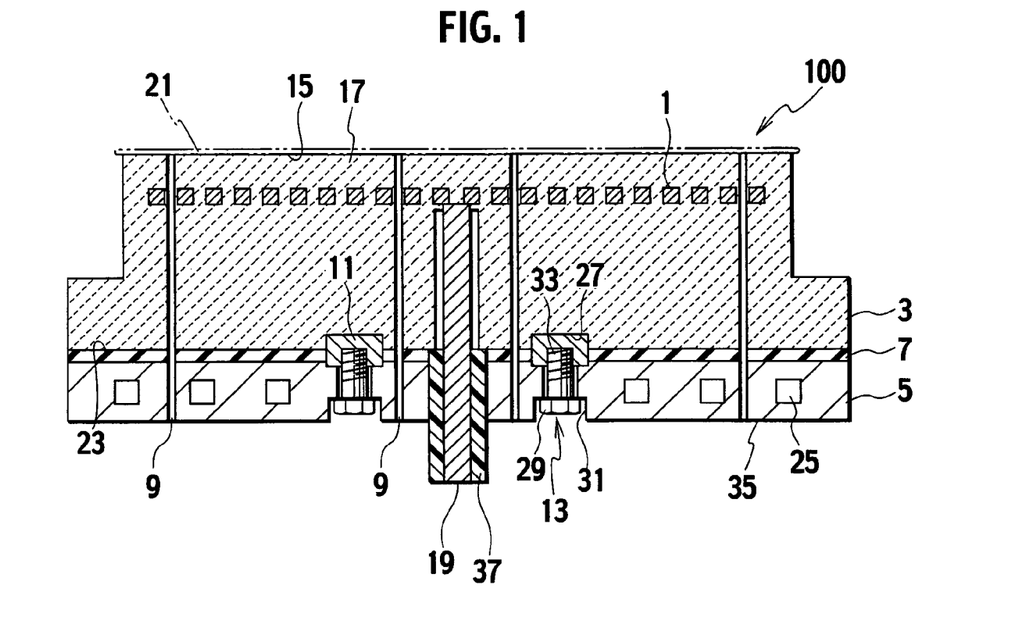
FIG. 1 is a cross-sectional view of an electrostatic chuck according to a first embodiment of the present invention.

FIG. 1 is a cross-sectional view passing through a diametrical center of an electrostatic chuck 100 according to a first embodiment. The electrostatic chuck 100 includes: a base 3 which contains ceramics, in which an electrode 1 generating electrostatic attractive force by being applied with a voltage is embedded; a cooling member 5 which contains metal; a bonding material 7 which bonds the base 3 and the cooling member 5 to each other; gas providing passages 9 which continuously penetrate the base 3, the bonding material 7, and the cooling member 5; and fixing members 11 and 13 which mechanically fix the base 3 and the cooling member 5 to each other. Each of the fixing members is composed of an engagement member 11 attached to a bottom portion of the base 3, and a bolt member 13 screwed to the engagement members 11.

The electrode 1 is embedded in an upper side of the base 3, and a portion from the electrode 1 to a substrate mounting surface 15 of a surface of the base is formed into a dielectric layer 17. Moreover, since an upper end of a power feeding member 19 is electrically connected to the electrode 1, the substrate mounting surface 15 generates the electrostatic attractive force by flowing a current from the power feeding member 19 to the electrode 1, thus making it possible to attract a substrate 21 (shown by a chain double-dashed line) by the substrate mounting surface 15.

Moreover, the electrostatic chuck 100 includes the gas providing passages 9 which flow heat transmission gas therethrough to a back surface of the substrate 21 mounted on the substrate mounting surface 15. Thus, the heat transmission gas flows through insides of the gas providing passages 9, and the heat transmission gas is provided to the substrate mounting surface formed on the surface of the base 3.

The base 3 is formed of aluminum nitride, silicon carbide, alumina, and the like. The bonding material 7 is coated on a bottom surface 23 of the base 3, and the base 3 is bonded to the cooling member 5 through the bonding member 7.

For the electrode 1, high melting point materials can be used, which include tungsten, niobium, molybdenum, tantalum, hafnium, platinum, tungsten carbide, alloys and compounds thereof, and the like. A shape of the electrode 1 is not limited, and a mesh-like one, a bulk-like one, a sheet-like one, and a comb teeth-like one can be used as the electrode 1. Moreover, the electrode 1 is not limited to a monopolar shape shown in FIG. 1, and may also be formed into a bipolar shape, or divided into plural pieces.

For the electrode 1, one formed by printing a printing paste, a bulk, a thin film formed by chemical vapor deposition (CVD) or physical vapor deposition (PVD), and the like can be used.

As a material of the cooling member 5, there can be used metal such as aluminum, titanium, and Kovar; a composite material of silicon and the alumina, a composite material of the aluminum and the silicon carbide, and a composite material of the silicon and ceramics such as the silicon carbide; an alloy of the silicon and the aluminum; or the like. In an inside of the cooling member 5, a coolant passage 25 is formed. The cooling member 5 can be cooled by flowing a coolant such as cooling water through the coolant passage 25.

For the bonding material 7, an organic material such as silicone resin and acrylic resin can be used. The bonding material 7 has sufficient adhesive force to bond the base 3 and the cooling member 5 to each other at a temperature lower than 100° C. However, the adhesive force of the bonding material 7 is reduced at a temperature exceeding 100° C. For the purpose of making up for such reduction of the adhesive force, the fixing members 11 and 13 according to this embodiment are used.

A shape of the bonding material 7 is not limited, and a bulk-like one, a sheet-like one, and the like can be used as the bonding material 7. Moreover, the bonding material 7 may also be formed on the bottom surface 23 of the base 3 or a surface of the cooling member 5 by printing a bonding material with low viscosity thereon by a screen printing method and the like.

As described above, the electrostatic chuck 100 includes, for example, the engagement members 11 and the bolt members 13, which are the fixing members which mechanically fix the cooling member 5 to the base 3 as shown in FIG. 1.

Each of the engagement members 11 is a cylindrical body having a bottom portion, and is fixed into a recessed portion 27 provided on the bottom portion of the base 3. Specifically, each engagement member 11 is bonded to the base 3 by crimping, welding, brazing, soldering, and the like. Moreover, a female screw is tapped on an inner circumferential surface of each engagement member 11, and a lower portion of each engagement portion 11 protrudes downward from the bonding material 7. The engagement members 11 are formed of the molybdenum, the niobium, the tungsten, the Kovar, the titanium, the tantalum, zirconium, alloys thereof, and the like.

Meanwhile, each of the bolt members 13 is formed of the aluminum, stainless steel, nickel, the Kovar, alloys thereof, and the like. A head portion 29 of each bolt member 13 is engaged with an engagement hole 31 formed on a bottom portion of the cooling member 5, and a male screw is threaded on an outer circumferential surface of a tip end portion 33 of each bolt member 13. Hence, when each bolt member 13 is rotated, the tip end portion 33 thereof is screwed to the engagement portion 11, and accordingly, the base 3 onto which the engagement members 11 are attached and the cooling member 5 can be mechanically fixed to each other.

Note that a shape of the engagement members 11 is not limited to the cylindrical body having the bottom portion, and nut-like ones and sleeve-like ones can be employed as the engagement members 11. Moreover, the female screw may also be formed on the tip end portion 33 of each bolt member 13, and the male screw may also be formed on the inner circumferential surface of each engagement member 11.

The gas providing passages 9 penetrate from the substrate mounting surface 15 of the base 3 to a bottom surface 35 of the cooling member 5. The base 3 and the cooling member 5 are mechanically fixed to each other by the engagement members 11 and the bolt members 13, and accordingly, the heat transmission gas can be prevented from passing through the bonded portion of the base 3 and the cooling member 5 and leaking into a chamber.

Since the power feeding member 19 is electrically connected to the electrode 1, the electrostatic attractive force can be generated on the substrate mounting surface 15 by applying the voltage to the electrode 1. The power feeding member 19 is formed of the molybdenum, the niobium, the titanium, the zirconium, the tantalum, alloys thereof, and the like. As a shape of the power feeding member 19, there can be employed a rod shape, a columnar shape, a cable shape, a plate shape, a cord shape, a cylinder shape, and the like.

The power feeding member 19 is fixed to the electrode 1 by the crimping, the welding, the brazing, the soldering, and the like.

An outer circumference of a lower portion of the power feeding member 19 is covered with a cylindrical insulating member 37, and the power feeding member 19 is electrically insulated from the cooling member 5 by the insulating member 37. The insulating member 37 is formed of fluorine resin, the alumina, and the like.

As described above, the electrostatic chuck 100 includes: the base 3; the cooling member 5; the bonding material 7 which bonds the base 3 and the cooling member 5 to each other; the gas providing passages 9; and the engagement members 11 and the bolt members 13, both of which are the fixing members which mechanically fix the cooling member 5 to the base 3.

Thus, even if the electrostatic chuck 100 is exposed to the temperature as high as 100° C. or more, a high bonding strength between the base 3 and the cooling member 5 can be maintained. Hence, under a high-temperature environment, the heat transmission gas can be prevented from passing through the bonded portion of the base 3 and the cooling member 5 and leaking into the chamber.

Second Embodiment

Subsequently, a description will be made of a second embodiment by using FIG. 2. Note that the same reference numerals will be assigned to the same structural portions as those of the above-described first embodiment, and a description thereof will be omitted.

Figure 2:
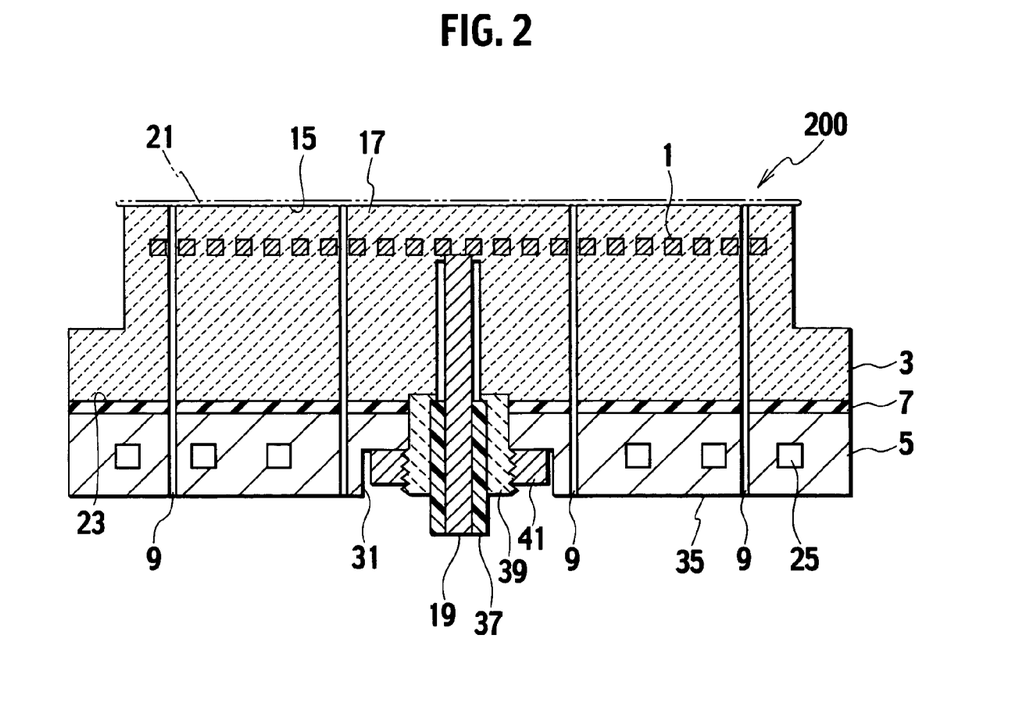
FIG. 2 is a cross-sectional view of an electrostatic chuck according to a second embodiment of the present invention.

An electrostatic chuck 200 of FIG. 2 includes a sleeve 39 attached to a lower end portion of the base 3, and a nut member 41, in place of the engagement members 11 and the bolt members 13, which are the fixing members of FIG. 1. The nut member 41 is screwed to the sleeve 39, thereby mechanically fixing the base 3 and the cooling member 5 to each other.

Here, the sleeve 39 is formed of metal such as the Kovar, the molybdenum, the niobium, the tungsten, the titanium, the tantalum, and the zirconium. A male screw is threaded on an outer circumferential surface of a lower end portion of the sleeve 39. The sleeve 39 is bonded to the bottom portion of the base 3 by the crimping, the welding, the brazing, the soldering, and the like, and such a male screw portion protrudes from a lower portion of the cooling member 5.

The engagement hole 31 is formed on the bottom portion of the cooling member 5, and the nut member 41 is housed in the engagement hole 31. The nut member 41 is formed of the aluminum, the stainless steel, the nickel, the Kovar, alloys thereof, and the like. A female screw is tapped on an inner circumferential surface of the nut member 41.

Hence, the nut member 41 is rotated to be screwed to the sleeve 39, thus making it possible to mechanically fix the base 3 and the cooling member 5 to each other, to which the sleeve 39 is fixed.

As described above, the electrostatic chuck 200 includes: the base 3; the cooling member 5; the bonding material 7 which bonds the base 3 and the cooling member 5 to each other; the gas providing passages 9 which continuously penetrate the base 3, the bonding material 7, and the cooling member 5; and the sleeve 39 and the nut member 41, both of which are the fixing members which mechanically fix the cooling member 5 to the base 3.

Thus, even if the electrostatic chuck 200 is exposed to an environment of the temperature as high as 100° C. or more, strong adhesion between the base 3 and the cooling member 5 can be maintained. Hence, under such a high-temperature environment, the heat transmission gas can be prevented from passing through the bonded portion of the base 3 and the cooling member 5 and leaking into the chamber.

Third Embodiment

Subsequently, a description will be made of a third embodiment by using FIG. 3. Note that the same reference numerals will be assigned to the same structural portions as those of the above-described first and second embodiments, and a description thereof will be omitted.

Figure 3:
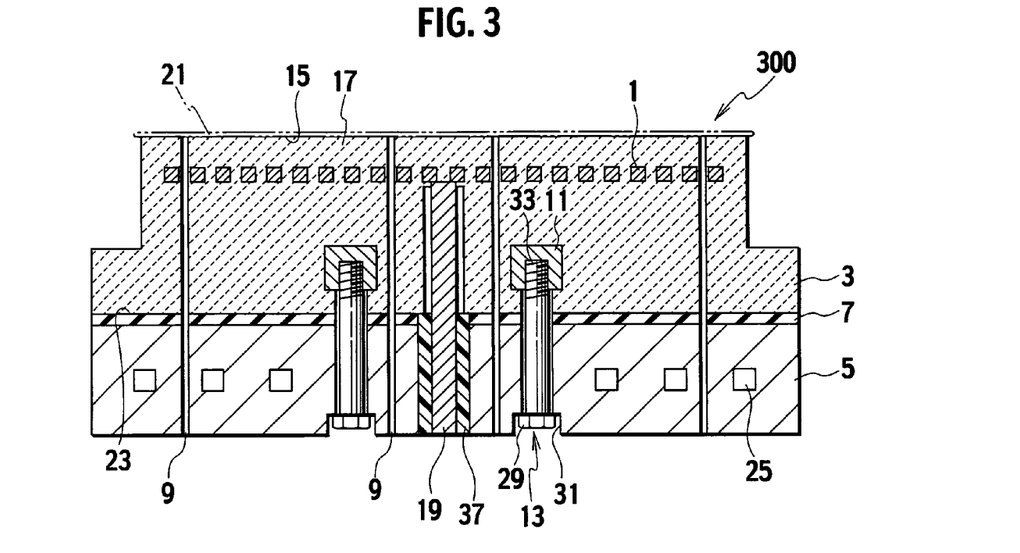
FIG. 3 is a cross-sectional view of an electrostatic chuck according to a third embodiment of the present invention.

An electrostatic chuck 300 of FIG. 3 includes engagement members 11 embedded in the base 3, and bolt members 13 screwed to the engagement members 11, in place of the engagement members 11 and the bolt members 13, which are the fixing members of FIG. 1. The male screw portions are formed on the tip end portions 33 of the bolt members 13, and the head portions 29 of the bolt members 13 are housed in and engaged with the engagement holes 31 formed in the bottom portion of the cooling member 5.

The bolt members 13 are screwed to the engagement members 11, thereby mechanically fixing the base 3 and the cooling member 5 to each other.

According to this embodiment, the engagement members 11 are embedded in the inside of the base 3, and accordingly, a bonding strength of the engagement members 11 to the base 3 is enhanced to a large extent as compared with that in the first embodiment. Hence, the bonding strength between the base 3 and the cooling member 5 is also enhanced.

Fourth Embodiment

Subsequently, a description will be made of a fourth embodiment by using FIG. 4. Note that the same reference numerals will be assigned to the same structural portions as those of the above-described first to third embodiments, and a description thereof will be omitted.

Figure 4:
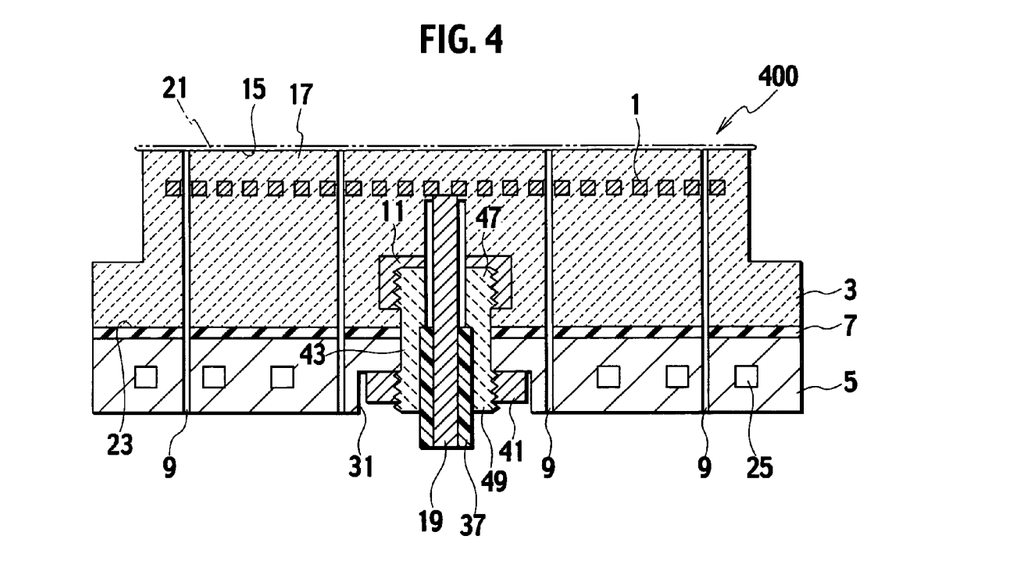
FIG. 4 is a cross-sectional view of an electrostatic chuck according to a fourth embodiment of the present invention.

An electrostatic chuck 400 of FIG. 4 includes an engagement member 11 embedded in the base 3, a nut member 41 housed in the engagement hole 31 of the cooling member 5, and a screw member 43 screwed to the engagement member 11 and the nut member 41, in place of the engagement members 11 and the bolt members 13, which are the fixing members of FIG. 1. The male screw portions are formed on an upper end portion 47 and lower end portion 49 of the screw member 43, the male screw portion of the upper end portion 47 is screwed to the engagement member 11, and the male screw portion of the lower end portion 49 is screwed to the nut member 41. The base 3 and the cooling member 5 are mechanically fixed to each other through the engagement member 11, the screw member 43, and the nut member 41.

According to this embodiment, the engagement member 11 is embedded in the base 3, and accordingly, the bonding strength of the engagement member 11 to the base 3 is enhanced to a large extent as compared with that in the second embodiment. Hence, the bonding strength between the base 3 and the cooling member 5 is also enhanced.

Fifth Embodiment

Subsequently, a description will be made of a fifth embodiment by using FIG. 5. Note that the same reference numerals will be assigned to the same structural portions as those of the above-described first to fourth embodiments, and a description thereof will be omitted.

Figure 5:
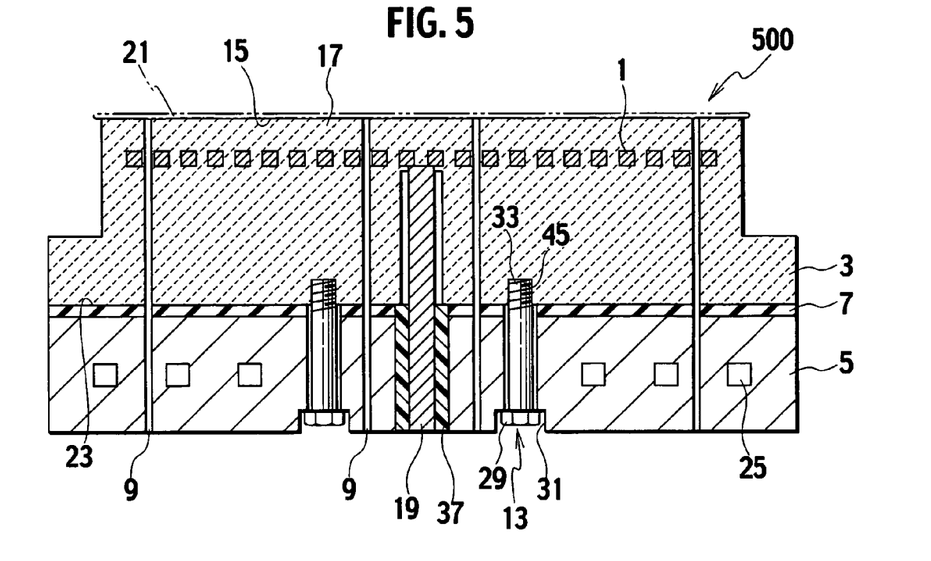
FIG. 5 is a cross-sectional view of an electrostatic chuck according to a fifth embodiment of the present invention.

An electrostatic chuck 500 of FIG. 5 includes bolt members 13 in place of the engagement members 11 and the bolt members 13, which are the fixing members of FIG. 1. The male screw portions are formed on the tip end portions 33 of the bolt members 13, and the head portions 29 of the bolt members 13 are housed in and engaged with the engagement holes 31 of the cooling member 5. Moreover, screw holes 45 are drilled in the bottom surface 23 of the base 3.

The head portions 29 of the bolt members 13 are engaged with the engagement holes 31 of the cooling member 5, and the tip end portions 33 thereof are screwed to the screw holes 45 of the base 3, thereby mechanically fixing the base 3 and the cooling member 5 to each other.

According to this embodiment, it is not necessary to provide the engagement members 11 used in the first and third embodiments, and accordingly, the base 3 and the cooling member 5 can be mechanically fixed to each other with a small number of parts.

Sixth Embodiment

Subsequently, a description will be made of a sixth embodiment by using FIG. 6. Note that the same reference numerals will be assigned to the same structural portions as those of the above-described first to fifth embodiments, and a description thereof will be omitted.

Figure 6:
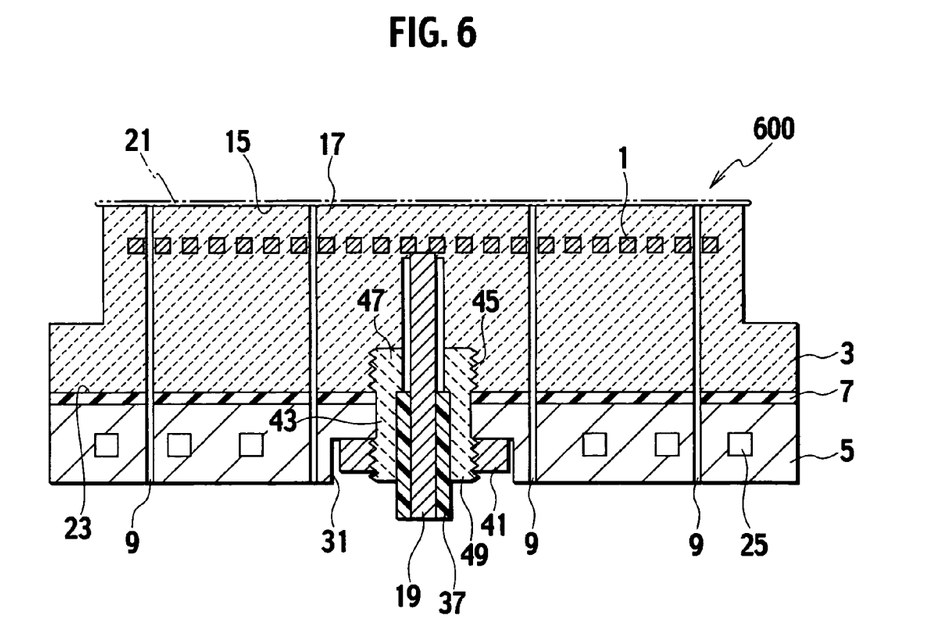
FIG. 6 is a cross-sectional view of an electrostatic chuck according to a sixth embodiment of the present invention.

An electrostatic chuck 600 of FIG. 6 includes a screw member 43 and a nut member 41 in place of the engagement members 11 and the bolt members 13, which are the fixing members of FIG. 1. The male screw portions are formed on the upper end portion 47 and lower end portion 49 of the screw member 43, and the screw hole 45 is formed in the bottom surface 23 of the base 3. Moreover, the engagement hole 31 is formed in the bottom portion of the cooling member 5, and the nut member 41 is housed in and engaged with the engagement hole 31.

The male screw portion of the upper end portion 47 of the screw member 43 is screwed to the screw hole 45 of the base 3, and the male screw portion of the lower end portion 49 thereof is screwed to the nut member 41, thereby mechanically fixing the base 3 and the cooling member 5 to each other.

According to this embodiment, it is not necessary to provide the engagement member 11 used in the fourth embodiment, and accordingly, the number of parts can be more reduced than in the fourth embodiment.

Seventh Embodiment

Subsequently, a description will be made of a seventh embodiment by using FIG. 7. Note that the same reference numerals will be assigned to the same structural portions as those of the above-described first to sixth embodiments, and a description thereof will be omitted.

Figure 7:
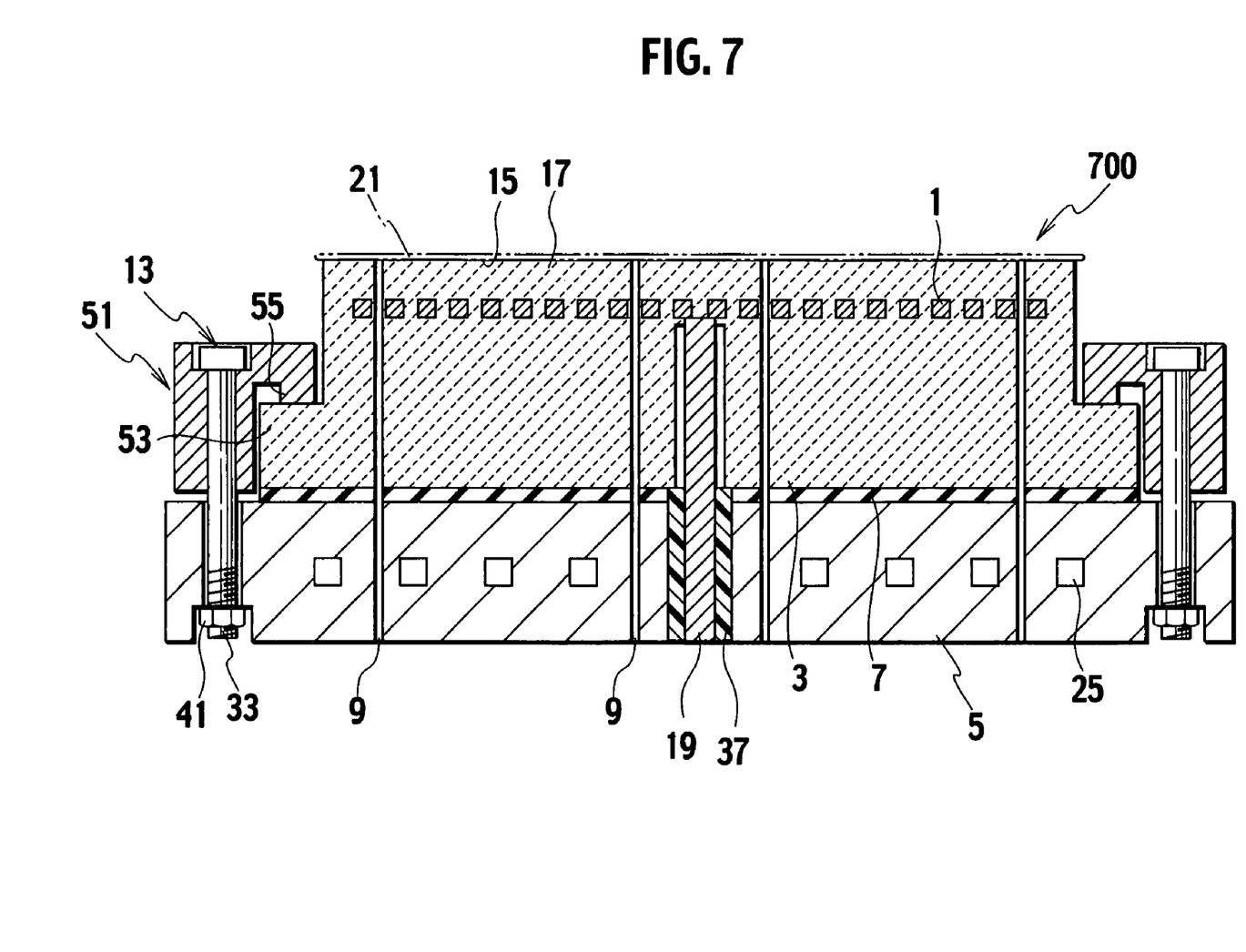
FIG. 7 is a cross-sectional view of an electrostatic chuck according to a seventh embodiment of the present invention.

An electrostatic chuck 700 of FIG. 7 includes bolt members 13, a clamping jig 51, and nut members 41, in place of the engagement members 11 and the bolt members 13, which are the fixing members of FIG. 1.

An outer circumferential portion of the base 3 on a lower side in the height direction is formed into a step difference portion 53 which protrudes toward the outside in the diameter direction. Moreover, the clamping jig 51 includes a pressing portion 55 which presses the step difference portion 53 of the base 3 downward. Then, in outer circumferential end portions of the clamping jig 51 and the cooling member 5, bolt insertion holes which penetrate the same in the vertical direction are formed.

The bolt members 13 are inserted through the bolt insertion holes, and the tip end portions 33 thereof are screwed to the nut members 41. Thus, the step difference portion 53 of the base 3 is pressed against the cooling member 5 by the pressing portion 55 of the clamping jig 51, and the base 3 and the cooling member 5 are mechanically fixed to each other.

According to this embodiment, the outer circumferential portion (step difference portion 53) of the base 3 is pressed against the cooling member 5, and is bonded thereto. Accordingly, the bonding strength between the base 3 and the cooling member 5 can be enhanced to a larger extent than in the case where the base 3 is fixed to the cooling member 5 by the center side thereof in the diameter direction.

Eighth Embodiment

Subsequently, a description will be made of an eighth embodiment by using FIG. 8. Note that the same reference numerals will be assigned to the same structural portions as those of the above-described first to seventh embodiments, and a description thereof will be omitted.

Figure 8:
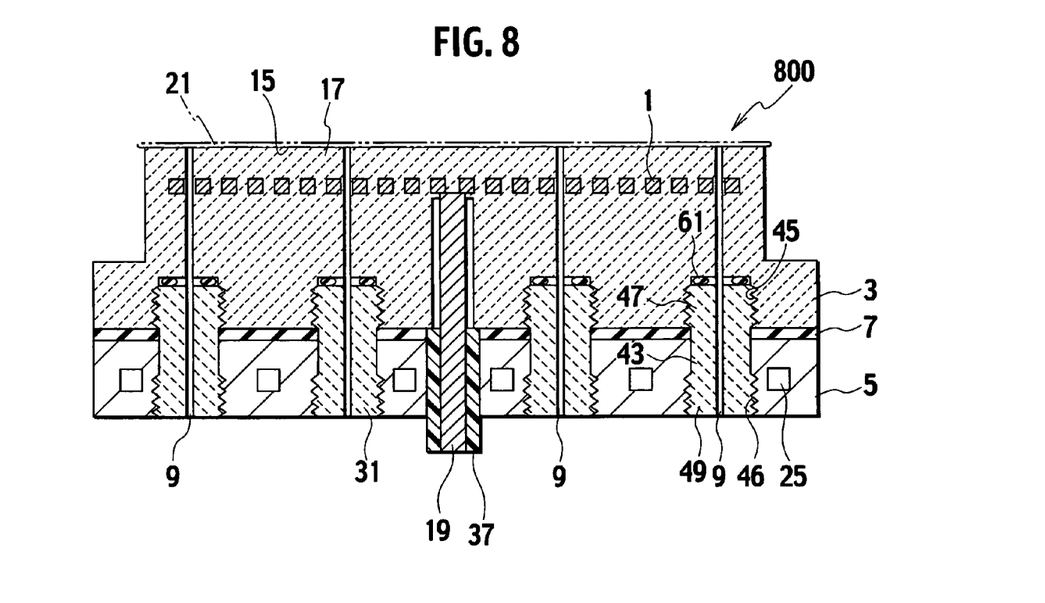
FIG. 8 is a cross-sectional view of an electrostatic chuck according to an eighth embodiment of the present invention.

An electrostatic chuck 800 of FIG. 8 includes screw members 43 and O-rings 61 in place of the engagement members 11 and the bolt members 13, which are the fixing members of FIG. 1.

The male screw portions are formed on the upper end portions 47 and lower end portions 49 of the screw members 43. The upper end portions 47 are screwed to the screw holes 45 of the base 3, and the lower end portions 49 are screwed to screw holes 46 of the cooling member 5. Moreover, the O-rings 61 are provided in the screw holes of the base 3, and the O-rings 61 are compressed and urged by upper end surfaces of the screw members 43 and upper surfaces of the screw holes of the base 3. Furthermore, gas providing passages 9 are provided in the screw members 43 in a manner of penetrating therethrough, and the gas providing passages 9 concerned communicate with the gas providing passages 9 of the base 3.

According to this embodiment, the upper end surfaces of the screw members 43 and the upper surfaces of the screw holes of the base 3 can be surely sealed together by using the O-rings 61.

Ninth Embodiment

Subsequently, a description will be made of a ninth embodiment by using FIG. 9. Note that the same reference numerals will be assigned to the same structural portions as those of the above-described first to eighth embodiments, and a description thereof will be omitted.

Figure 9:
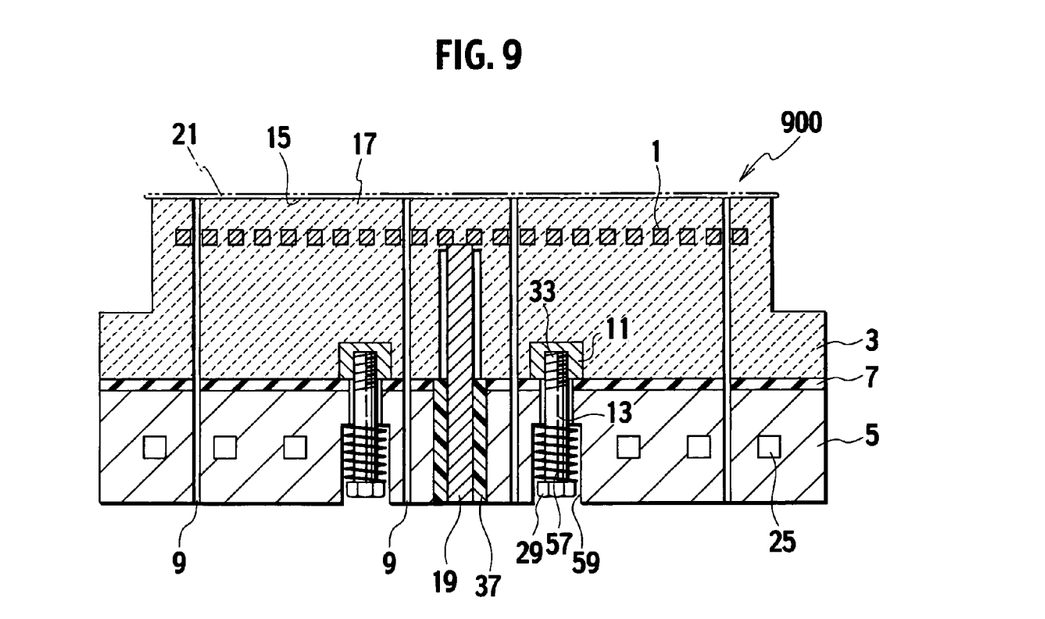
FIG. 9 is a cross-sectional view of an electrostatic chuck according to a ninth embodiment of the present invention.

An electrostatic chuck 900 of FIG. 9 includes engagement members 11, bolt members 13, and springs 57, in place of the engagement members 11 and the bolt members 13, which are the fixing members of FIG. 1.

In the cooling member 5, bolt holes are drilled in the vertical direction, and the bolt holes are formed so that a diameter of upper sides thereof can be small and that a diameter of lower sides thereof can be large. The lower sides described above are composed as spring housing portions 59 capable of housing the springs 57 therein. The tip end portions 33 of the bolt members 13 are screwed to the engagement members 11, and the springs 57 are wound around lower outer circumferences of the bolt members 13. The springs 57 are compressed and urged in the vertical direction by upper surfaces of the spring housing portions 59 and by the head portions 29 of the bolt members 13.

According to this embodiment, the bolt members 13 around which the springs 57 are wound are screwed to the engagement members 11 of the base 3, thus making it possible to fix the cooling member 5 to the base 3 while giving elastic force thereto. Specifically, since the base 3 and the cooling member 5 are held elastically by using the springs 57, even if the electrostatic chuck 900 is heated up to a high temperature, dimensional changes of the base 3 and the cooling member 5 owing to thermal expansion thereof can be absorbed efficiently.

Note that the present invention is not limited to the above-described embodiments, and various embodiments can be adopted as long as the fixing members are the ones to mechanically fix the cooling member 5 to the base 3.

EXAMPLES

Next, a specific description will be made of the present invention through an example and a comparative example.

Example

As the example, the electrostatic chuck 100 shown in FIG. 1 was prepared. The engagement members 11 provided in the electrostatic chuck 100 are made of the molybdenum (Mo), and have a diameter of 5.5 mm and a thickness of 6 mm, in which the female screws are formed on the inner circumferential surfaces. Moreover, stainless steel-made M4 bolts in which the male screws are formed on the tip end portions 33 were used as the bolt members 13.

In the bottom surface 23 of the base 3, four holes with a diameter of 6 mm and a depth of 3 mm were formed around the power feeding member 19 at an equal interval in the circumferential direction. Next, the engagement members 11 were bonded to the four holes by aluminum brazing.

The cooling member 5 was formed of the aluminum. In the cooling member 5, holes for placing the engagement members 11 and the bolt members 13 screwed to the engagement members 11 concerned were formed.

Next, the base 3 and the cooling member 5 were bonded to each other by using the organic bonding material 7, and thereafter, the bolt members 13 were screwed to the engagement members 11.

Moreover, as the comparative example, an electrostatic chuck substantially similar to that of FIG. 1 was prepared. However, in the electrostatic chuck of the comparative example, the female screws were not formed on the inner circumferential surfaces of the engagement members, or the male screws were not formed on the outer circumferential surfaces of the bolt members, either. Hence, the bolt members and the engagement members were not screwed to each other, or were not mechanically bonded to each other.

Evaluation Method

The electrostatic chucks according to the example and the comparative example were placed in a vacuum chamber, and plasma was generated therein. Thereafter, a voltage of 500V was applied to the electrodes 1 to attract the substrates 21, and He gas was provided to the substrate mounting surfaces 15 so that a pressure thereof could be 20 Torr. Plasma power was adjusted, so that the temperature of the electrostatic chucks was made to reach 150° C., the state was held for an hour, and providing amounts of the He gas at that time were measured.

Evaluation Result

A description will be made below of an evaluation result.

In the electrostatic chuck according to the example, the providing amount of He gas was less than 2 sccm (ml/min). In the example, with regard to the providing amount of He gas, a substantially equal result to that at the room temperature was obtained, and the He gas did not pass through the bonded portion of the base 3 and the cooling member 5, or did not leak to the outside of the electrostatic chuck.

In the electrostatic chuck according to the comparative example, the providing amount of He gas exceeded 15 sccm (ml/min). This is considered to be caused by the He gas leaking from the bonded portion.

From the above-described result, it was verified that, by fixing the base 3 and the cooling member 5 to each other by the engagement members 11 and the bolt members 13, the He gas could be prevented from leaking into the chamber from the bonded portion even if the electrostatic chuck was heated up to the temperature of 150° C.

Specifically, by mechanically bringing the base 3 and the cooling member 5 into pressure contact with each other, the heat transmission gas was able to be restricted from passing through the bonded portion of the base 3 and the cooling member 5 and leaking to the outside of the electrostatic chuck under the environment of the temperature as high as 100° C. or more. Thus, it became possible to obtain the electrostatic chuck usable even at the high temperature.

What is claimed is:

1. An electrostatic chuck comprising:
a base made of ceramics, the base including an electrode which generates electrostatic attractive force;
a cooling member which contains metal;
a bonding material which bonds the base and the cooling member to each other;
a gas providing passage which penetrates the base, the bonding material, and the cooling member, the gas providing passage having gas flow through an inside thereof; and
a fixing member which mechanically fixes the base and the cooling member to each other, wherein the fixing member is composed of a sleeve attached to the base, and a nut member provided in the cooling member and fastened to the sleeve.

2. A electrostatic chuck comprising;
a base made of ceramics, the base including an electrode which generates electrostatic attractive force;
a cooling member which contains metal;
a bonding material which bonds the base and the cooling member to each other;
a gas providing passage which penetrates the base, the bonding material, and the cooling member, the gas providing passage having gas flow through an inside thereof; and
a fixing member which mechanically fixes the base and the cooling member to each other, wherein the fixing member is composed of an engagement member embedded in an inside of the base, a nut member formed in the cooling member, and a screw member which couples the engagement member and the nut member to each other.

3. An electrostatic chuck comprising:
a base made of ceramics, the base including an electrode which generates electrostatic attractive force;
a cooling member which contains metal;
a bonding material which bonds the base and the cooling member to each other;
a gas providing passage which penetrates the base, the bonding material, and the cooling member, the gas providing passage having gas flow through an inside thereof; and
a fixing member which mechanical fixes the base and the cooling member to each other, wherein the fixing member is composed of a screw hole formed in a bottom portion of the base, a nut member engaged with the cooling member, and a screw member which couples the screw hole and the nut member to each other.

4. An electrostatic chuck comprising:
a base made of ceramics, the base including an electrode which generates electrostatic attractive force;
a cooling member which contains metal;
a bonding material which bonds the base and the cooling member to each other;

a gas providing passage which penetrates the base, the bonding material, and the cooling member, the gas providing passage having gas flow through an inside thereof; and a fixing member which mechanically fixes the base and the cooling member to each other, wherein the fixing member is composed of a screw hole formed in a bottom portion of the base, a screw hole formed in the cooling member, a screw member fastened to the screw holes, and an O-ring housed in the screw hole of the base and compressed by the screw member.

5. An electrostatic chuck comprising:

a base made of ceramics, the base including an electrode which generates electrostatic attractive force;

a cooling member which contains metal;

a bonding material which bonds the base and the cooling member to each other;

a gas providing passage which penetrates the base, the bonding material, and the cooling member, the gas providing passage having gas flow through an inside thereof; and a fixing member which mechanically fixes the base and the cooling member to each other, wherein the fixing member is composed of an engagement member attached to a bottom portion of the base, a bolt member fastened to the engagement member, and a spring attached to the bolt member and compressed in a direction of separating the bolt member and the cooling member from each other.

6. An electrostatic chuck, comprising:

a base made of at least one of AlN, $Al_2O_3$ and SiC, the base including an electrode which generates electrostatic attractive force;

a cooling member which contains metal;

an organic bonding material which bonds the base and the cooling member to each other;

a gas providing passage which penetrates the base, the bonding material, and the cooling member, the gas providing passage having gas flow through an inside thereof; and a fixing member which mechanically fixes the base and the cooling member to each other, wherein the fixing member is composed of an engagement member attached to a bottom portion of the base, and a bolt member provided in the cooling member and fastened to the engagement member.

7. An electrostatic chuck, comprising:

a base made of at least one of AlN, $Al_2O_3$ and SiC, the base including an electrode which generates electrostatic attractive force;

a cooling member which contains metal;

an organic bonding material which bonds the base and the cooling member to each other;

a gas providing passage which penetrates the base, the bonding material, and the cooling member, the gas providing passage having gas flow through an inside thereof; and a fixing member which mechanically fixes the base and the cooling member to each other, wherein the fixing member is composed of an engagement member embedded in an inside of the base, and a bolt member engaged with the cooling member and fastened to the engagement member.

8. An electrostatic chuck, comprising:

a base made of at least one of AlN, $Al_2O_3$ and SiC, the base including an electrode which generates electrostatic attractive force;

a cooling member which contains metal;

an organic bonding material which bonds the base and the cooling member to each other;

a gas providing passage which penetrates the base, the bonding material, and the cooling member, the gas providing passage having gas flow through an inside thereof; and a fixing member which mechanically fixes the base and the cooling member to each other, wherein the fixing member is composed of a threaded hole formed in the bottom portion of the base, and a bolt member engaged with the cooling member and fastened to the threaded hole.

* * * * *

UNITED STATES PATENT AND TRADEMARK OFFICE
CERTIFICATE OF CORRECTION

PATENT NO.        : 7,403,386 B2
APPLICATION NO.   : 11/449551
DATED             : July 22, 2008
INVENTOR(S)       : Yasufumi Aihara, Hideyoshi Tsuruta and Keiji Kawasaki It is certified that error appears in the above-identified patent and that said Letters Patent is hereby corrected as shown below:

<u>Column 10</u>

*Line 29*:   please change "A" to --An-- and change ";" to --:--

*Line 55*:   please change "mechanical" to --mechanically--

Signed and Sealed this

Twenty-third Day of September, 2008

JON W. DUDAS
*Director of the United States Patent and Trademark Office*